(12) United States Patent
Murgia et al.

(10) Patent No.: US 10,123,112 B2
(45) Date of Patent: Nov. 6, 2018

(54) MICROPHONE PACKAGE WITH AN INTEGRATED DIGITAL SIGNAL PROCESSOR

(71) Applicant: INVENSENSE, INC., San Jose, CA (US)

(72) Inventors: Carlo Murgia, Sunnyvale, CA (US); James Lim, Saratoga, CA (US); Fariborz Assaderaghi, Emerald Hills, CA (US); Anthony Minervini, Palos Hills, IL (US)

(73) Assignee: INVENSENSE, INC., San Jose, CA (US)

( * ) Notice: Subject to any disclaimer, the term of this patent is extended or adjusted under 35 U.S.C. 154(b) by 152 days.

(21) Appl. No.: 14/959,478

(22) Filed: Dec. 4, 2015

(65) Prior Publication Data

US 2017/0164107 A1 Jun. 8, 2017

(51) Int. Cl.
| | |
|---|---|
| *H04R 3/00* | (2006.01) |
| *H04R 1/04* | (2006.01) |
| *H04R 19/00* | (2006.01) |
| *H04R 19/04* | (2006.01) |

(52) U.S. Cl.
CPC .............. *H04R 3/005* (2013.01); *H04R 1/04* (2013.01); *H04R 19/005* (2013.01); *H04R 19/04* (2013.01); *H04R 2201/003* (2013.01); *H04R 2430/20* (2013.01)

(58) Field of Classification Search
CPC ........ H04R 3/005; H04R 31/006; H04R 1/04; H04R 2201/003; H04R 2430/20; H04R 19/005; H04R 19/04; G10L 21/0216; G10L 2021/02166

USPC ..................................................... 381/92, 122
See application file for complete search history.

(56) References Cited

U.S. PATENT DOCUMENTS

| | | | |
|---|---|---|---|
| 8,204,252 B1 | 6/2012 | Avendano | |
| 8,804,982 B2 | 8/2014 | Michel et al. | |
| 8,949,120 B1 | 2/2015 | Every et al. | |
| 2005/0175204 A1* | 8/2005 | Bock .................... | H04R 25/405 381/330 |
| 2008/0192962 A1 | 8/2008 | Halteren | |
| 2008/0217709 A1* | 9/2008 | Minervini ............. | B81B 7/0061 257/416 |
| 2010/0303274 A1 | 12/2010 | Ryan et al. | |

(Continued)

*Primary Examiner* — Matthew Eason
*Assistant Examiner* — Ammar Hamid
(74) *Attorney, Agent, or Firm* — Amin, Turocy & Watson, LLP

(57) ABSTRACT

Systems and techniques for providing improved beam forming functionality and/or improve noise cancellation functionality in a microphone package are presented. In an implementation, a device includes a first microelectromechanical systems (MEMS) sensor, a second MEMS sensor, and a digital signal processor. The first MEMS sensor is contained in a first back cavity within the device. The second MEMS sensor is contained in a second back cavity within the device. The digital signal processor generates a cardioid microphone pattern based on data associated with the first MEMS sensor contained in the first back cavity and other data associated with the second MEMS sensor contained in the second back cavity, where the digital signal processor forms at least a portion of the first back cavity and the second back cavity.

21 Claims, 10 Drawing Sheets

(56) References Cited

U.S. PATENT DOCUMENTS

| | | | |
|---|---|---|---|
| 2010/0329492 A1* | 12/2010 | Derleth | G10L 21/0208 |
| | | | 381/317 |
| 2011/0182436 A1 | 7/2011 | Murgia et al. | |
| 2014/0003633 A1* | 1/2014 | Liu | H04R 1/04 |
| | | | 381/174 |
| 2014/0205107 A1 | 7/2014 | Murgia et al. | |
| 2015/0023523 A1 | 1/2015 | Elian et al. | |
| 2015/0035094 A1 | 2/2015 | Laermer et al. | |
| 2015/0296306 A1* | 10/2015 | Shao | H04R 19/005 |
| | | | 381/174 |
| 2016/0165361 A1* | 6/2016 | Miller | H04R 25/43 |
| | | | 381/317 |
| 2016/0234604 A1* | 8/2016 | Saxena | H04R 19/04 |

* cited by examiner

MICROPHONE PACKAGE WITH AN INTEGRATED DIGITAL SIGNAL PROCESSOR

TECHNICAL FIELD

The subject disclosure relates generally to microphone package, and more specifically, to a microphone package with an integrated digital signal processor.

BACKGROUND

Conventionally, microelectromechanical systems (MEMS) microphones can comprise a MEMS chip attached to a substrate. These MEMS chips are generally enclosed by a cover or lid forming a single acoustic back cavity. An acoustic input can be provided from an opening on a top surface of the microphone such as on the cover or lid or from an opening on the substrate. Typically, in conventional applications where the acoustic input is from the top, an acoustic back cavity is formed mainly by a volume under the MEMS chip and the substrate. By contrast, in conventional applications where the acoustic input is from the bottom, an acoustic back cavity is typically formed by the volume enclosed by the substrate and the cover or lid.

However, acoustic characteristics of such conventional MEMS microphones are limited by the MEMS microphones' device characteristics and the physical constraints imposed on the geometry of the microphone package. It is thus desired to provide a microphone package (e.g., a microphone package including multiple MEMS microphones) that improves upon conventional MEMS microphone packages and/or conventional MEMS applications while minimizing size of the microphone package and maximizing acoustic diversity. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with an implementation, a device includes a first microelectromechanical systems (MEMS) sensor, a second MEMS sensor, and a digital signal processor. The first MEMS sensor is contained in a first back cavity within the device. The second MEMS sensor is contained in a second back cavity within the device. The digital signal processor generates a cardioid microphone pattern based on data associated with the first MEMS sensor contained in the first back cavity and other data associated with the second MEMS sensor contained in the second back cavity, where the digital signal processor forms at least a portion of the first back cavity and the second back cavity.

In accordance with another implementation, a system includes at least a digital signal processor. The digital signal processor receives first data associated with a first MEMS sensor contained in a first back cavity formed by the digital signal processor and a substrate. The digital signal processor also receives second data associated with a second MEMS sensor contained in a second back cavity formed by the digital signal processor and the substrate. Furthermore, the digital signal processor generates microphone data based on the first data associated with the first MEMS sensor contained in the first back cavity and the second data associated with the second MEMS sensor contained in the second back cavity.

In accordance with yet another implementation, a method provides for bonding an application-specific integrated circuit (ASIC) associated with a digital signal processor to a first substrate associated with a first microelectromechanical systems (MEMS) sensor, where the ASIC and the first substrate form a first back cavity for the first MEMS sensor. The method also provides for bonding a second substrate associated with a second MEMS sensor to the ASIC associated with the digital signal processor, where the ASIC and the second substrate form a second back cavity for the second MEMS sensor.

These and other embodiments are described in more detail below.

BRIEF DESCRIPTION OF THE DRAWINGS

Various non-limiting embodiments are further described with reference to the accompanying drawings, in which.

DETAILED DESCRIPTION

Overview

Figure 1:
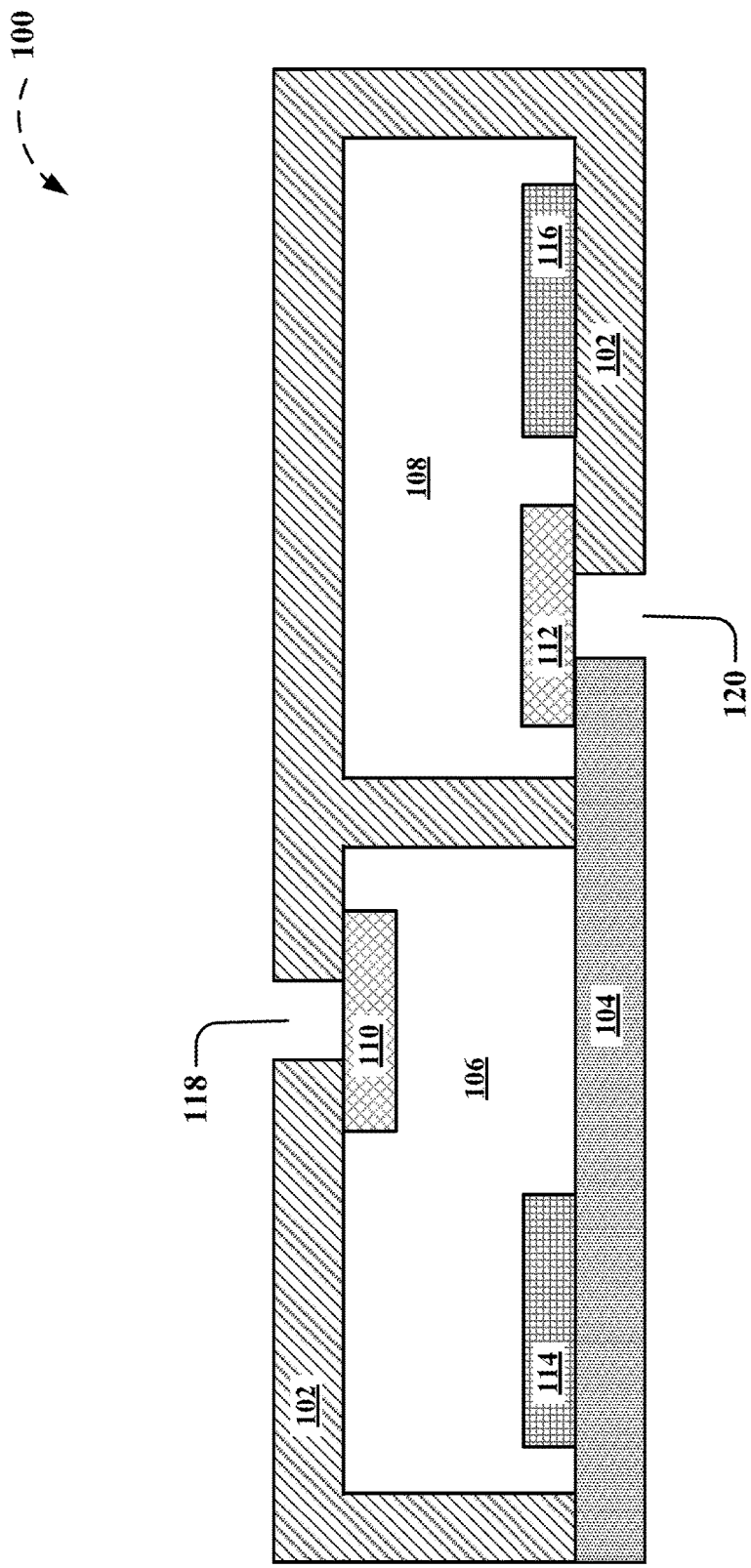
FIG. 1 depicts a non-limiting example of a microphone package with an integrated digital signal processor (DSP), in accordance with various aspects and implementations described herein.

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

As described above, microelectromechanical systems (MEMS) microphones can comprise a MEMS chip attached to a substrate. These MEMS chips are generally enclosed by a cover or lid forming a single acoustic back cavity. An acoustic input can be provided from an opening on a top surface of the microphone such as on the cover or lid or from an opening on the substrate. Typically, in conventional applications where the acoustic input is from the top, an acoustic back cavity is formed mainly by a volume under the MEMS chip and the substrate. By contrast, in conventional applications where the acoustic input is from the bottom, an acoustic back cavity is typically formed by the volume enclosed by the substrate and the cover or lid. However, acoustic characteristics of such conventional MEMS microphones are limited by the MEMS microphones' device characteristics and the physical constraints imposed on the geometry of the microphone package. Moreover, it is desirable to provide a microphone package (e.g., a microphone package including multiple MEMS microphones) that provides desirable beam forming characteristics and/or noise cancelling characteristics while minimizing size of the microphone package and maximizing acoustic diversity (e.g., providing different acoustic paths from a source to a MEMS microphone).

To these and/or related ends, various aspects associated with a microphone package with improved beam forming characteristics, improved noise cancelling characteristics and/or reduced size are described. The various embodiments of the apparatuses, techniques, and methods of the subject disclosure are described in the context of a device (e.g., a microphone package) that includes at least a digital signal processor (DSP) associated with at least a first sensor (e.g., a first MEMS sensor) and a second sensor (e.g., a second MEMS sensor). For example, exemplary embodiments of the subject disclosure employ a DSP to generate microphone data based at least on first data associated with a first sensor (e.g., a first MEMS sensor) and second data associated with a second sensor (e.g., a second MEMS sensor). The first sensor that provides the first data to the DSP can be contained in a first back cavity, where a portion of the first back cavity is formed by the DSP. Furthermore, the second sensor that provides the second data to the DSP can be contained in a second back cavity, where a portion of the second back cavity is also formed by the DSP. It is to be appreciated that the microphone data can also be generated based on additional data (e.g., third data associated with a third sensor contained in the first back cavity, fourth data associated with a fourth sensor contained in the second back cavity, etc). Therefore, the DSP can serve mechanically as a back cavity portion for a microphone package as well as electronically for providing, for example, microphone data. As such, beam forming characteristics and/or noise cancelling characteristics of a microphone package (e.g., microphone data provided by the microphone package) can be improved. Moreover, a microphone package with a reduced physical size can be provided. However, as further detailed below, various exemplary implementations can be applied to other areas of a microphone package and/or a DSP, without departing from the subject matter described herein.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

FIG. 1 depicts a device 100, according to various non-limiting aspects of the subject disclosure. The device 100 can be, for example, a microphone package. For example, the device 100 can be a microphone housing (e.g., a microphone module). The device 100 includes a substrate 102 and a digital signal processor (DSP) 104. The substrate 102 and the DSP 104 can form a first back cavity 106 and a second back cavity 108. For example, the device 100 can comprise an enclosure comprising the substrate 102 and the DSP 104 that can define the first back cavity 106 and the second back cavity 108. Therefore, the first back cavity 106 and the second back cavity 108 can be contained within the device 100.

At least a first sensor 110 can be contained in the first back cavity 106. The first sensor 110 can be, for example, a first microelectromechanical systems (MEMS) sensor (e.g., a first MEMS microphone sensor, a first MEMS acoustic sensor, etc.). For example, the first sensor 110 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezoresistive MEMS microphone, a condenser MEMS microphone, an electret MEMS microphone, an analog MEMS microphone, a digital MEMS microphone, another type of MEMS microphone, etc. Furthermore, at least a second sensor 112 can be contained in the second back cavity 108. The second sensor 112 can be, for example, a second MEMS sensor (e.g., a second MEMS microphone sensor, a second MEMS acoustic sensor, etc.). For example, the second sensor 112 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezoresistive MEMS microphone, a condenser MEMS microphone, an electret MEMS microphone, an analog MEMS microphone, a digital MEMS microphone, another type of MEMS microphone, etc. In an implementation, the first sensor 110 can be mechanically affixed to the substrate 102 and/or can be communicably coupled thereto. Furthermore, the second sensor 112 can be mechanically affixed to the substrate 102 and the DSP 104 and/or the second sensor 112 can be communicably coupled thereto. In an aspect, the first sensor 110 can be affixed to the substrate 102 via eutectic bonding. Additionally or alternatively, the second sensor 112 can be affixed to the substrate 102 and/or the DSP 104 via eutectic bonding. For example, a eutectic metal seal can be formed between the first sensor 110 and the substrate 102.

Additionally or alternatively, a eutectic metal seal can be formed between the second sensor 112 and the substrate 102. Furthermore, a eutectic metal seal can additionally or alternatively be formed between the second sensor 112 and the DSP 104.

In certain implementations, an application specific integrated circuit (ASIC) 114 can also be contained in the first back cavity 106. Additionally or alternatively, an ASIC 116 can also be contained in the second back cavity 108. In one example, the ASIC 114 and/or the ASIC 116 can be a non-acoustic sensor. In another example, the ASIC 114 and/or the ASIC 116 can be a DSP. The ASIC 114 can be mechanically affixed to the DSP 104 and/or can be communicably coupled thereto. In one example, the ASIC 114 can be affixed to the DSP 104 via eutectic bonding (e.g., a eutectic metal seal can be formed between the ASIC 114 and the DSP 104). Furthermore, the ASIC 116 can be mechanically affixed to the substrate 102 and/or can be communicably coupled thereto. In one example, the ASIC 116 can be affixed to the substrate 102 via eutectic bonding (e.g., a eutectic metal seal can be formed between the ASIC 116 and the substrate 102). In an aspect, the first back cavity 106 can be an enclosed back cavity with an opening 118. Similarly, the second back cavity 108 can be an enclosed back cavity with an opening 120. The opening 118 and the opening 120 can be an opening that is adapted to receive acoustic waves or acoustic pressure. For example, the first sensor 110 can receive an acoustic signal via the opening 118 and the second sensor 112 can receive an acoustic signal via the opening 120. With the device 100, the opening 118 and the opening 120 can be positioned on different surfaces of the device 100 (e.g., the opening 118 and the opening 120 can be positioned on opposite surfaces of the device 100). In another aspect, the DSP 104 can form at least a portion of the first back cavity 106 and the second back cavity 108. For example, the DSP 104 can form an entire back wall for the first back cavity 106 (e.g., an entire back wall that is associated with the ASIC 114) and at least a portion of a front wall for the second back cavity 108 (e.g., at least a portion of a front wall that is associated with the second sensor 112). Furthermore, the substrate 102 can form another portion of the first back cavity 106 and the second back cavity 108. Therefore, the device 100 can be a microphone package with an integrated DSP. In yet another aspect, the substrate 102 can include a first substrate portion and a second substrate portion separated by the opening 118 associated with the first back cavity 106.

The DSP 104 can be mechanically, electrically, and/or communicatively coupled to the first sensor 110, the second sensor 112, the ASIC 114 and/or the ASIC 116. For example, the DSP 104 can be communicably coupled to the first sensor 110 via the substrate 102 and/or via bonding wire(s) or a eutectic bonding technique. Furthermore, the DSP 104 can be communicably coupled to the second sensor 112 via the substrate 102, via bonding wire(s), via a eutectic bonding technique and/or via direct coupling to the second sensor 112. In one example, the DSP 104 can be affixed to substrate 102 via eutectic bonding (e.g., a eutectic metal seal can be formed between the DSP 104 and the substrate 102). In certain implementations, the DSP 104 can be associated with a codec. In an example, the DSP 104 can be associated with an ASIC complementary metal oxide semiconductor (CMOS) chip. The DSP 104 can be configured to generate a microphone pattern based on data associated with the first sensor 110 contained in the first back cavity 106 and other data associated with the second sensor 112 contained in the second back cavity 108. For example, the DSP 104 can generate a cardioid microphone pattern based on data associated with the first sensor 110 contained in the first back cavity 106 and other data associated with the second sensor 112 contained in the second back cavity 108. In certain implementations, the DSP 104 can generate a plurality of cardioid microphone patterns. For example, the DSP 104 can generate a first cardioid microphone pattern based on the data associated with the first sensor 110 contained in the first back cavity 106 and a second cardioid microphone pattern based on the other data associated with the second sensor 112 contained in the second back cavity 108.

In an aspect, the DSP 104 can be configured to generate a noise suppressed signal based on a first cardioid signal associated with the first sensor 110 contained in the first back cavity 106 and a second cardioid signal associated with the second sensor 112 contained in the second back cavity 108. For example, the DSP 104 can generate the noise suppressed signal based on a level of difference between the first cardioid signal associated with the first sensor 110 contained in the first back cavity 106 and the second cardioid signal associated with the second sensor 112 contained in the second back cavity 108. In another example, the DSP 104 can determine a first transfer function for the first cardioid signal associated with the first sensor 110 contained in the first back cavity 106 and a second transfer function for the second cardioid signal associated with the second sensor 112 contained in the second back cavity 108. Therefore, the DSP 104 can generate the noise suppressed signal based on the first transfer function and the second transfer function. The DSP 104 can additionally or alternatively be configured to generate a signal associated with echo suppression and/or echo cancellation based on data associated with the first sensor 110 contained in the first back cavity 106 and other data associated with the second sensor 112 contained in the second back cavity 108 (e.g., without a reference signal associated with a codec and/or an external amplifier). For example, the DSP 104 can employ an acoustic echo suppression (AES) technique and/or an acoustic echo cancellation (AEC) technique to generate microphone data based on data associated with the first sensor 110 contained in the first back cavity 106 and other data associated with the second sensor 112 contained in the second back cavity 108 (e.g., without a reference signal associated with a codec and/or an external amplifier).

In another aspect, the DSP 104 can process, filter and/or analyze frequency bands of the data associated with the first sensor 110 contained in the first back cavity 106 and/or other frequency bands of the other data associated with the second sensor 112 contained in the second back cavity 108. In one example, the DSP 104 can analyze the frequency bands and/or the other frequency bands based on a set of acoustic models. In yet another aspect, the DSP 104 can generate synthetic directional microphone patterns based on the data associated with the first sensor 110 contained in the first back cavity 106 and the other data associated with the second sensor 112 contained in the second back cavity 108. In yet another aspect, the DSP 104 can apply a weight (e.g., an equalization coefficient, a noise suppression coefficient, an adaptive constraint, a gain, etc.) to the data associated with the first sensor 110 contained in the first back cavity 106 and the other data associated with the second sensor 112 contained in the second back cavity 108.

It is to be appreciated that configuration of the first sensor 110, the second sensor 112, the ASIC 114 and the ASIC 116 in the first back cavity 106 and the second back cavity 108 is an exemplary implementation. For example, it is to be appreciated that the first sensor 110, the second sensor 112, the ASIC 114 and the ASIC 116 can be implemented in the first back cavity 106 and the second back cavity 108 in a different manner. It is also to be appreciated that the first back cavity 106 and/or the second back cavity 108 can include another sensor (e.g., the first back cavity 106 can include a third sensor, the second back cavity 108 can include a fourth sensor). In a non-limiting example, the first back cavity 106 can additionally include a third MEMS sensor and the second back cavity 108 can additionally include a fourth MEMS sensor. As such, the DSP 104 can employ other data associated with other sensor(s) in the first back cavity 106 and/or the second back cavity 108.

Figure 2:
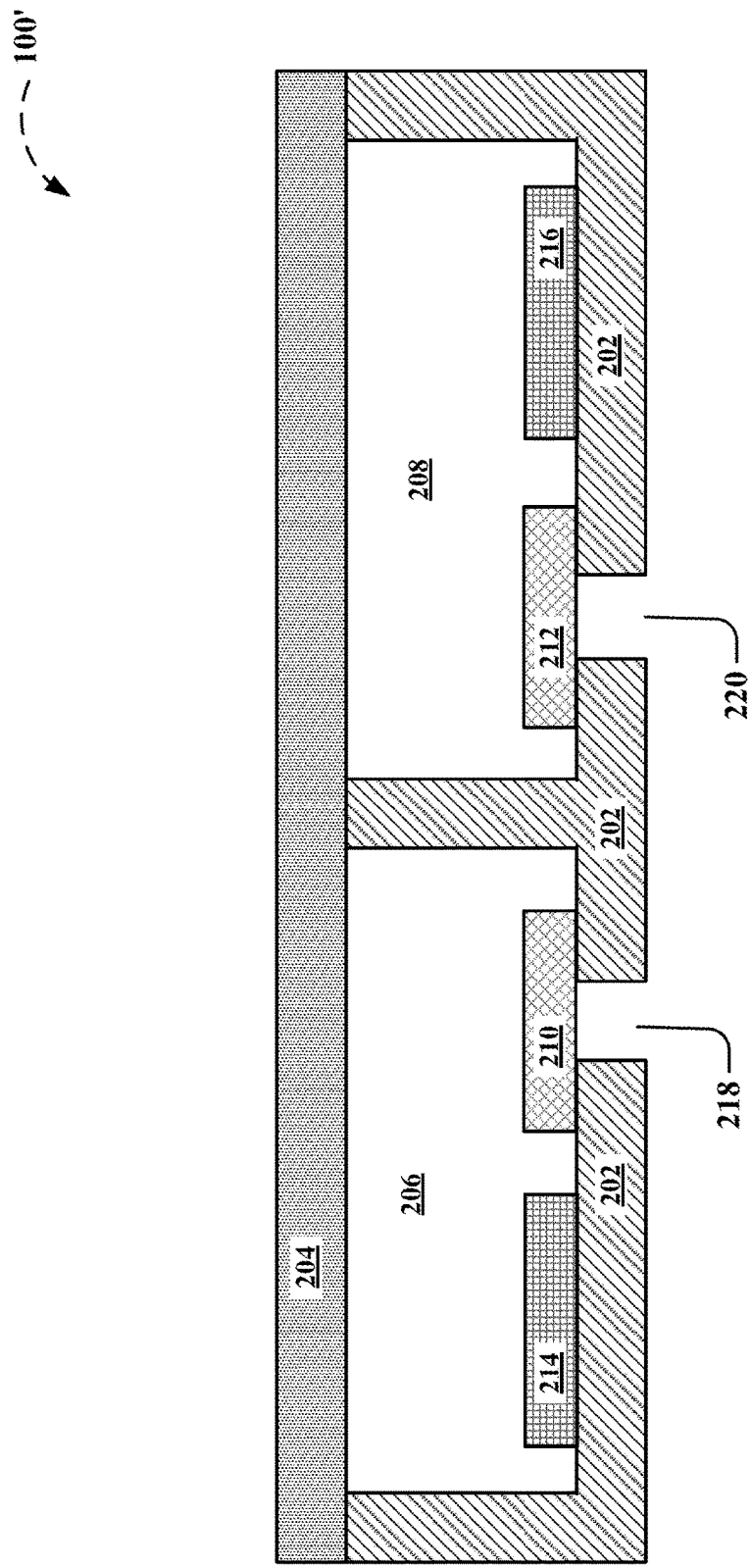
FIG. 2 depicts another non-limiting example of the microphone package, in accordance with various aspects and implementations described herein.

FIG. 2 depicts a device 100', according to various non-limiting aspects of the subject disclosure. The device 100' can be a different embodiment of the device 100. As such, the device 100' can also be, for example, a microphone package. For example, the device 100' can be a microphone housing (e.g., a microphone module). The device 100' includes a substrate 202 and a DSP 204. The substrate 202 and the DSP 204 can form a first back cavity 206 and a second back cavity 208. For example, the device 100' can comprise an enclosure comprising the substrate 202 and the DSP 204 that can define the first back cavity 206 and the second back cavity 208. Therefore, the first back cavity 206 and the second back cavity 208 can be contained within the device 100'. In an aspect, the DSP 204 can form at least a portion of the first back cavity 206 and the second back cavity 208. For example, the DSP 204 can form an entire back wall of the first back cavity 206 and the second back cavity 208. Furthermore, the substrate 202 can form another portion of the first back cavity 206 and the second back cavity 208. Therefore, the device 100' can be a microphone package with an integrated DSP. In one example, the DSP 204 can be affixed to substrate 202 via eutectic bonding (e.g., a eutectic metal seal can be formed between the DSP 204 and the substrate 202).

At least a first sensor 210 can be contained in the first back cavity 206. As with the first sensor 110, the first sensor 210 can be, for example, a first MEMS sensor (e.g., a first MEMS microphone sensor, a first MEMS acoustic sensor, etc.). For example, the first sensor 210 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezoresistive MEMS microphone, a condenser MEMS microphone, an electret MEMS microphone, an analog MEMS microphone, a digital MEMS microphone, another type of MEMS microphone, etc. Furthermore, at least a second sensor 212 can be contained in the second back cavity 208. As with the second sensor 112, the second sensor 212 can be, for example, a second MEMS sensor (e.g., a second MEMS microphone sensor, a second MEMS acoustic sensor, etc.). For example, the second sensor 212 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezoresistive MEMS microphone, a condenser MEMS microphone, an electret MEMS microphone, an analog MEMS microphone, a digital MEMS microphone, another type of MEMS microphone, etc. In an implementation, the first sensor 210 and the second sensor 212 can be mechanically affixed to the substrate 202 and/or can be communicably coupled thereto.

In certain implementations, an ASIC 214 can also be contained in the first back cavity 206. Additionally or alternatively, an ASIC 216 can also be contained in the second back cavity 208. In one example, the ASIC 214 and/or the ASIC 216 can be a non-acoustic sensor. In another example, the ASIC 214 and/or the ASIC 216 can be a DSP. The ASIC 214 can be mechanically affixed to the DSP 204 and/or can be communicably coupled thereto. Furthermore, the ASIC 216 can be mechanically affixed to the substrate 202 and/or can be communicably coupled thereto. In an aspect, the first back cavity 206 can be an enclosed back cavity with an opening 218. Similarly, the second back cavity 208 can be an enclosed back cavity with an opening 220. The opening 218 and the opening 220 can be an opening that is adapted to receive acoustic waves or acoustic pressure. For example, the first sensor 210 can receive an acoustic signal via the opening 218 and the second sensor 212 can receive an acoustic signal via the opening 220. In an aspect, the substrate 202 can include a first substrate portion, a second substrate portion and a third substrate portion. The first substrate portion and the second substrate portion of the substrate 202 can be separated by the opening 218 associated with the first back cavity 106. Furthermore, the second substrate portion and the third substrate portion of the substrate 202 can be separated by the opening 220 associated with the second back cavity 108. With the device 100', the opening 218 and the opening 220 can be positioned on a same surface of the device 100'.

The substrate 202 can be mechanically, electrically, and/or communicatively coupled to the first sensor 210, the second sensor 212, the ASIC 214 and/or the ASIC 216. For example, the substrate 202 can be communicably coupled to the first sensor 210 and the second sensor 212 via the substrate 202 and/or via bonding wire(s). In an aspect, the first sensor 210 and/or the ASIC 214 can be affixed to the substrate 202 via eutectic bonding. Additionally or alternatively, the second sensor 212 and/or the ASIC 216 can be affixed to the substrate 102 via eutectic bonding. For example, a eutectic metal seal can be formed between the first sensor 210, the ASIC 214 and/or the substrate 202. Additionally or alternatively, a eutectic metal seal can be formed between the second sensor 212, the ASIC 216 and/or the substrate 202. In certain implementations, the DSP 204 can be associated with a codec. In an example, the DSP 204 can be associated with an ASIC CMOS chip. The DSP 204 can be configured to generate a microphone pattern based on data associated with the first sensor 210 contained in the first back cavity 206 and other data associated with the second sensor 212 contained in the second back cavity 208. For example, the DSP 204 can be configured to generate a cardioid microphone pattern based on data associated with the first sensor 210 contained in the first back cavity 206 and other data associated with the second sensor 212 contained in the second back cavity 208.

In an implementation, the DSP 204 can generate a plurality of cardioid microphone patterns. For example, the DSP 204 can generate a first cardioid microphone pattern based on the data associated with the first sensor 210 contained in the first back cavity 206 and a second cardioid microphone pattern based on the other data associated with the second sensor 212 contained in the second back cavity 208. In an aspect, the DSP 204 can be configured to generate a noise suppressed signal based on a first cardioid signal associated with the first sensor 210 contained in the first back cavity 206 and a second cardioid signal associated with the second sensor 212 contained in the second back cavity 208. For example, the DSP 204 can generate the noise suppressed signal based on a level of difference between the first cardioid signal associated with the first sensor 210 contained in the first back cavity 206 and the second cardioid signal associated with the second sensor 212 contained in the second back cavity 208. In another example, the DSP 204 can determine a first transfer function for the first cardioid signal associated with the first sensor 210 contained in the first back cavity 206 and a second transfer function for the second cardioid signal associated with the second sensor 212 contained in the second back cavity 208. Therefore, the DSP 204 can generate the noise suppressed signal based on the first transfer function and the second transfer function. The DSP 204 can additionally or alternatively be configured to generate a signal associated with echo suppression and/or echo cancellation based on data associated with the first sensor 210 contained in the first back cavity 206 and other data associated with the second sensor 212 contained in the second back cavity 208 (e.g., without a reference signal associated with a codec and/or an external amplifier). For example, the DSP 204 can employ an AES technique and/or an AEC technique to generate microphone data based on data associated with the first sensor 210 contained in the first back cavity 206 and other data associated with the second sensor 212 contained in the second back cavity 208 (e.g., without a reference signal associated with a codec and/or an external amplifier).

The DSP 204 can also process, filter and/or analyze frequency bands of the data associated with the first sensor 210 contained in the first back cavity 206 and/or other frequency bands of the other data associated with the second sensor 212 contained in the second back cavity 208. In one example, the DSP 204 can analyze the frequency bands and/or the other frequency bands based on a set of acoustic models. In yet another aspect, the DSP 204 can generate synthetic directional microphone patterns based on the data associated with the first sensor 210 contained in the first back cavity 206 and the other data associated with the second sensor 212 contained in the second back cavity 208. In yet another aspect, the DSP 204 can apply a weight (e.g., an equalization coefficient, a noise suppression coefficient, an adaptive constraint, a gain, etc.) to the data associated with the first sensor 210 contained in the first back cavity 206 and the other data associated with the second sensor 212 contained in the second back cavity 208.

It is to be appreciated that configuration of the first sensor 210, the second sensor 212, the ASIC 214 and the ASIC 216 in the first back cavity 206 and the second back cavity 208 is an exemplary implementation. For example, it is to be appreciated that the first sensor 210, the second sensor 212, the ASIC 214 and the ASIC 216 can be implemented in the first back cavity 206 and the second back cavity 208 in a different manner. It is also to be appreciated that the first back cavity 206 and/or the second back cavity 208 can include another sensor (e.g., the first back cavity 206 can include a third sensor, the second back cavity 208 can include a fourth sensor). In a non-limiting example, the first back cavity 206 can additionally include a third MEMS sensor and the second back cavity 208 can additionally include a fourth MEMS sensor. As such, the DSP 204 can employ other data associated with other sensor(s) in the first back cavity 206 and/or the second back cavity 208.

Figure 3:
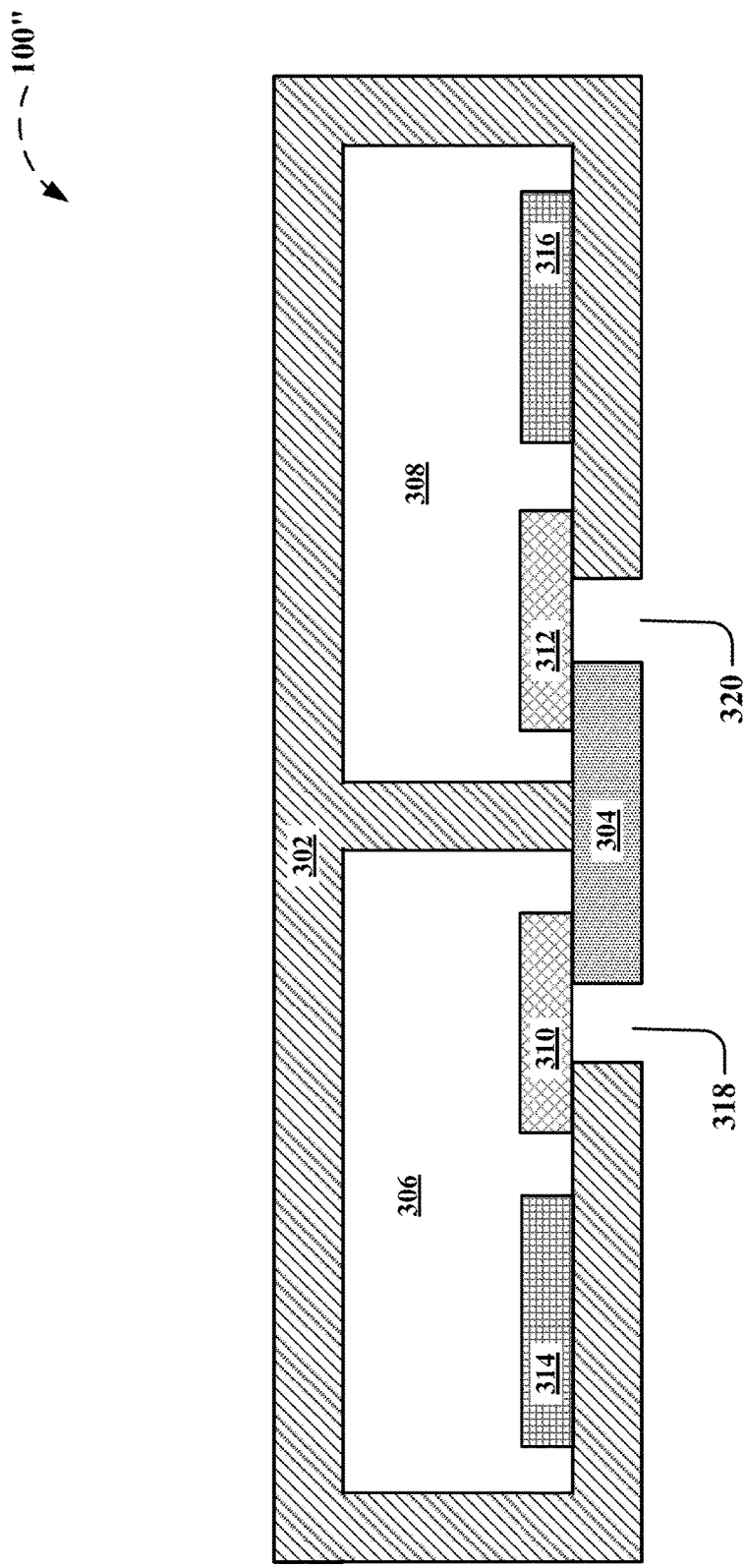
FIG. 3 depicts yet another non-limiting example of the microphone package, in accordance with various aspects and implementations described herein.

FIG. 3 depicts a device 100", according to various non-limiting aspects of the subject disclosure. The device 100" can be a different embodiment of the device 100 and/or the device 100'. Therefore, the device 100" can be, for example, a microphone package. For example, the device 100" can be a microphone housing (e.g., a microphone module). The device 100" includes a substrate 302 and a DSP 304. The substrate 302 and the DSP 304 can form a first back cavity 306 and a second back cavity 308. For example, the device 100" can comprise an enclosure comprising the substrate 202 and the DSP 204 that can define the first back cavity 206 and the second back cavity 208. Therefore, the first back cavity 306 and the second back cavity 308 can be contained within the device 100".

At least a first sensor 310 can be contained in the first back cavity 306. As with the first sensor 110 and the first sensor 210, the first sensor 310 can be, for example, a first MEMS sensor (e.g., a first MEMS microphone sensor, a first MEMS acoustic sensor, etc.). For example, the first sensor 310 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezeoresistive MEMS microphone, a condenser MEMS microphone, an electret MEMS microphone, an analog MEMS microphone, a digital MEMS microphone, another type of MEMS microphone, etc. Furthermore, at least a second sensor 312 can be contained in the second back cavity 308. As with the second sensor 112 and the second sensor 212, the second sensor 312 can be, for example, a second MEMS sensor (e.g., a second MEMS microphone sensor, a second MEMS acoustic sensor, etc.). For example, the second sensor 312 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezeoresistive MEMS microphone, a condenser MEMS microphone, an electret MEMS microphone, an analog MEMS microphone, a digital MEMS microphone, another type of MEMS microphone, etc. In an implementation, the first sensor 310 and the second sensor 312 can be mechanically affixed to the substrate 302 and the DSP 304. Additionally or alternatively, the first sensor 310 and the second sensor 312 can be communicably coupled to the substrate 302 and the DSP 304. In certain implementations, an ASIC 314 can also be contained in the first back cavity 306. Additionally or alternatively, an ASIC 316 can also be contained in the second back cavity 308. In one example, the ASIC 314 and/or the ASIC 316 can be a non-acoustic sensor. In another example, the ASIC 314 and/or the ASIC 316 can be a DSP. The ASIC 314 and the ASIC 316 can be mechanically affixed to the substrate 302 and/or can be communicably coupled thereto.

In an aspect, the first back cavity 306 can be an enclosed back cavity with an opening 318. Similarly, the second back cavity 308 can be an enclosed back cavity with an opening 320. The opening 318 and the opening 320 can be an opening that is adapted to receive acoustic waves or acoustic pressure. For example, the first sensor 310 can receive an acoustic signal via the opening 318 and the second sensor 312 can receive an acoustic signal via the opening 320. With the device 100", the opening 318 and the opening 320 can be positioned on a same surfaces of the device 100". In another aspect, the DSP 304 can form at least a portion of the first back cavity 306 and the second back cavity 308. For example, the DSP 304 can form a portion of a front wall for the first back cavity 206 and the second back cavity 208 (e.g., a portion of a front wall that is associated with the first sensor 310 and the second sensor 312). Furthermore, the substrate 302 can form another portion of the first back cavity 306 and the second back cavity 308. Therefore, the device 100" can be a microphone package with an integrated DSP. In one example, the DSP 304 can be affixed to substrate 302 via eutectic bonding (e.g., a eutectic metal seal can be formed between the DSP 304 and the substrate 302).

The DSP 304 can be mechanically, electrically, and/or communicatively coupled to the first sensor 310, the second sensor 312, the ASIC 314 and/or the ASIC 316. For example, the DSP 304 can be communicably coupled to the first sensor 310 and the second sensor 312 via the substrate 302, via bonding wire(s) and/or via direct coupling to the first sensor 310 and the second sensor 312. In an aspect, the first sensor 310 can be affixed to the substrate 302 and/or the DSP 304 via eutectic bonding. Additionally or alternatively, the second sensor 312 can be affixed to the substrate 302 and/or the DSP 304 via eutectic bonding. For example, a eutectic metal seal can be formed between the first sensor 310 and the substrate 302. Furthermore, a eutectic metal seal can additionally or alternatively be formed between the first sensor 310 and the DSP 304. Additionally or alternatively, a eutectic metal seal can be formed between the second sensor 312 and the substrate 302. Furthermore, a eutectic metal seal can additionally or alternatively be formed between the second sensor 312 and the DSP 304. In another aspect, the ASIC 314 and/or the ASIC 316 can be affixed to the substrate 302 via eutectic bonding (e.g., a eutectic metal seal can be formed between the ASIC 314 and the substrate 302 and/or a eutectic metal seal can be formed between the ASIC 316 and the substrate 302). In certain implementations, the DSP 304 can be associated with a codec. In an example, the DSP 304 can be associated with an ASIC CMOS chip. The DSP 304 can be configured to generate a microphone pattern based on data associated with the first sensor 310 contained in the first back cavity 306 and other data associated with the second sensor 312 contained in the second back cavity 308. For example, the DSP 304 can be configured to generate a cardioid microphone pattern based on data associated with the first sensor 310 contained in the first back cavity 306 and other data associated with the second sensor 312 contained in the second back cavity 308.

In an implementation, the DSP 304 can generate a plurality of cardioid microphone patterns. For example, the DSP 304 can generate a first cardioid microphone pattern based on the data associated with the first sensor 310 contained in the first back cavity 306 and a second cardioid microphone pattern based on the other data associated with the second sensor 312 contained in the second back cavity 308. In an aspect, the DSP 304 can be configured to generate a noise suppressed signal based on a first cardioid signal associated with the first sensor 310 contained in the first back cavity 306 and a second cardioid signal associated with the second sensor 312 contained in the second back cavity 308. For example, the DSP 304 can generate the noise suppressed signal based on a level of difference between the first cardioid signal associated with the first sensor 310 contained in the first back cavity 306 and the second cardioid signal associated with the second sensor 312 contained in the second back cavity 308. In another example, the DSP 304 can determine a first transfer function for the first cardioid signal associated with the first sensor 310 contained in the first back cavity 306 and a second transfer function for the second cardioid signal associated with the second sensor 312 contained in the second back cavity 308. Therefore, the DSP 304 can generate the noise suppressed signal based on the first transfer function and the second transfer function. The DSP 304 can additionally or alternatively be configured to generate a signal associated with echo suppression and/or echo cancellation based on data associated with the first sensor 310 contained in the first back cavity 306 and other data associated with the second sensor 312 contained in the second back cavity 308 (e.g., without a reference signal associated with a codec and/or an external amplifier). For example, the DSP 304 can employ an AES technique and/or an AEC technique to generate microphone data based on data associated with the first sensor 310 contained in the first back cavity 306 and other data associated with the second sensor 312 contained in the second back cavity 308 (e.g., without a reference signal associated with a codec and/or an external amplifier).

The DSP 304 can also process, filter and/or analyze frequency bands of the data associated with the first sensor 310 contained in the first back cavity 306 and/or other frequency bands of the other data associated with the second sensor 312 contained in the second back cavity 308. In one example, the DSP 304 can analyze the frequency bands and/or the other frequency bands based on a set of acoustic models. In yet another aspect, the DSP 304 can generate synthetic directional microphone patterns based on the data associated with the first sensor 310 contained in the first back cavity 306 and the other data associated with the second sensor 312 contained in the second back cavity 308. In yet another aspect, the DSP 304 can apply a weight (e.g., an equalization coefficient, a noise suppression coefficient, an adaptive constraint, a gain, etc.) to the data associated with the first sensor 310 contained in the first back cavity 306 and the other data associated with the second sensor 312 contained in the second back cavity 308.

It is to be appreciated that configuration of the first sensor 310, the second sensor 312, the ASIC 314 and the ASIC 316 in the first back cavity 306 and the second back cavity 308 is an exemplary implementation. For example, it is to be appreciated that the first sensor 310, the second sensor 312, the ASIC 314 and the ASIC 316 can be implemented in the first back cavity 306 and the second back cavity 308 in a different manner. It is also to be appreciated that the first back cavity 306 and/or the second back cavity 308 can include another sensor (e.g., the first back cavity 306 can include a third sensor, the second back cavity 308 can include a fourth sensor). In a non-limiting example, the first back cavity 306 can additionally include a third MEMS sensor and the second back cavity 308 can additionally include a fourth MEMS sensor. As such, the DSP 304 can employ other data associated with other sensor(s) in the first back cavity 306 and/or the second back cavity 308.

Figure 4:
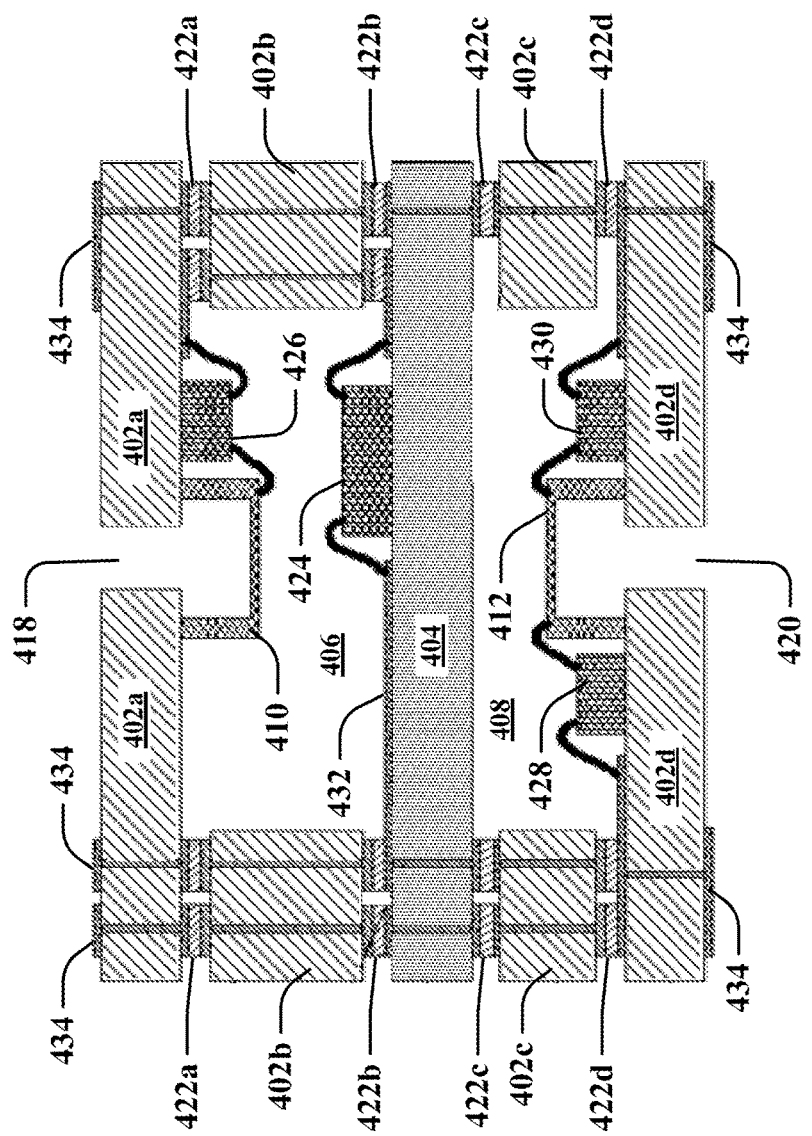
FIG. 4 depicts a non-limiting example of another microphone package with an integrated DSP, in accordance with various aspects and implementations described herein.

FIG. 4 depicts a device 400, according to various non-limiting aspects of the subject disclosure. The device 400 can be, for example, a microphone package (e.g., a microphone package with an integrated DSP). For example, the device 400 can be a microphone housing (e.g., a microphone module). The device 400 includes a substrate 402 and a DSP 404. In an aspect, the DSP 404 can comprise functionality of the DSP 104, the DSP 204 and/or the DSP 304, as more fully disclosed herein. The substrate 402 of the device 400 can be a multilayer substrate. For example, the substrate 402 can include a first substrate layer 402*a*, a second substrate layer 402*b*, a third substrate layer 402*c*, and a fourth substrate layer 402*d*. The first substrate layer 402*a* and the second substrate layer 402*b* can be separated by first conductive joining layer 422*a*. Furthermore, the second substrate layer 402*b* and the DSP 404 can be separated by a second conductive joining layer 422*b*. The first substrate layer 402*a*, the second substrate layer 402*b*, the DSP 404, the first conductive joining layer 422*a* and the second conductive joining layer 422*b* can be configured to form a first back cavity 406.

The DSP 404 and the third substrate layer 402*c* can be separated by a third conductive joining layer 422*c*. Furthermore, the third substrate layer 402*c* and the fourth substrate layer 402*d* can be separated by a fourth conductive joining layer 422*d*. The third substrate layer 402*c*, the fourth substrate layer 402*d*, the DSP 404, the third conductive joining layer 422*c* and the fourth conductive joining layer 422*d* can be configured to form a second back cavity 408. Therefore, the DSP 404 can be employed as a separation between the first back cavity 406 and the second back cavity 408. In an aspect, the conductive joining layers 422*a-d* can be bonded to a substrate layer (e.g., substrate layer 402*a-d*) and/or the DSP 404 via Eutectic bonding (e.g., the conductive joining layers 422*a-d* can facilitate Eutectic bonding).

A first sensor 410 can be contained in the first back cavity 406. In one example, the first sensor 410 can be a first MEMS sensor (e.g., a first MEMS microphone sensor, a first MEMS acoustic sensor, etc.). For example, the first sensor 410 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezoresistive MEMS microphone, a condenser MEMS microphone, an electret MEMS microphone, an analog MEMS microphone, a digital MEMS microphone, another type of MEMS microphone, etc. Also, a second sensor 412 can be contained in the second back cavity 408. In one example, the second sensor 412 can be a second MEMS sensor (e.g., a second MEMS microphone sensor, a second MEMS acoustic sensor, etc.). For example, the second sensor 412 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezoresistive MEMS microphone, a condenser MEMS microphone, an electret MEMS microphone, an analog MEMS microphone, a digital MEMS microphone, another type of MEMS microphone, etc. In an aspect, the DSP 404 can form a back volume partition for the first back cavity 406 and the second back cavity 408. For example, the DSP 404 can form a cavity wall that is shared between the first back cavity 406 and the second back cavity 408. In an implementation, the first sensor 410 can be affixed to the first substrate layer 402*a* via eutectic bonding. Additionally or alternatively, the second sensor 412 can be affixed to the fourth substrate layer 402*d* via eutectic bonding. For example, a eutectic metal seal can be formed between the first sensor 410 and the first substrate 402*a*. Additionally or alternatively, a eutectic metal seal can be formed between the second sensor 412 and the fourth substrate layer 402*d*.

In an aspect, the device 400 can include an aperture 418 associated with the first sensor 410 and an aperture 420 associated with the second sensor 412. For example, the first substrate layer 402*a* can include the aperture 418. The first sensor 410 can receive an acoustic signal via the aperture 418. Therefore, the aperture 418 can be an opening (e.g., an audio port, an audio path, an audio channel, an audio passage, etc.) associated with the first sensor 410. Furthermore, the fourth substrate layer 402*d* can include the aperture 420. The second sensor 412 can receive an acoustic signal via the aperture 420. Therefore, the aperture 420 can be an opening (e.g., an audio port, an audio path, an audio channel, an audio passage, etc.) associated with the second sensor 412.

In certain implementations, an ASIC 424 and/or an ASIC 426 can also be contained in the first back cavity 406. In one example, the ASIC 424 and/or an ASIC 426 can be an acoustic MEMS sensor. In another example, the ASIC 424 and/or an ASIC 426 can be a non-acoustic MEMS sensor. However, it is to be appreciated that the ASIC 424 and/or an ASIC 426 can be a different type of ASIC (e.g., a different MEMS device). Additionally or alternatively, an ASIC 428 and/or an ASIC 430 can also be contained in the second back cavity 408. In one example, the ASIC 428 and/or an ASIC 430 can be an acoustic MEMS sensor. In another example, the ASIC 428 and/or an ASIC 430 can be a non-acoustic MEMS sensor. However, it is to be appreciated that the ASIC 428 and/or an ASIC 430 can be a different type of ASIC (e.g., a different MEMS device). In an aspect, conductive trace(s) can electrically couple the ASIC 424, the ASIC 426, the ASIC 428 and/or the ASIC 430 to conductive joining layer(s) 422*a-d*. For example, a conductive trace 432 can electrically couple the ASIC 424 to the conductive joining layer 422*b*. In another aspect, the ASIC 424, the ASIC 426, the ASIC 428 and/or the ASIC 430 can be affixed to the substrate layers 402*a-d* and/or the DSP 404 via eutectic bonding. For example, a eutectic metal seal can be formed between an ASIC (e.g., ASIC 424, the ASIC 426, the ASIC 428 and/or the ASIC 430) and a substrate layer 402*a-d*. Additionally or alternatively, a eutectic metal seal can be formed between an ASIC (e.g., ASIC 424, the ASIC 426, the ASIC 428 and/or the ASIC 430) and the DSP 404. In yet another aspect, the device 400 can include solder pad(s) 434. For example, the first substrate layer 402*a* and/or the fourth substrate layer 402*d* can be associated with solder pad(s) 434. The solder pad(s) 434 can facilitate an electrical connection of the device 400 with another device (e.g., a printed circuit board, an ASIC, a CMOS layer, etc.).

In a non-limiting example, the device 400 can be MEMS microphone package constructed with all laminate materials, where two or more MEMS die are incorporated in the MEMS microphone package. Each of the two or more MEMS die can include a back volume and the acoustic ports (e.g., the aperture 418 and the aperture 420) positioned on different surfaces of the MEMS microphone package. The back volumes (e.g., the first back cavity 406 and the second back cavity 408) can be vertically stacked upon each other as opposed to side by side.

Figure 5:
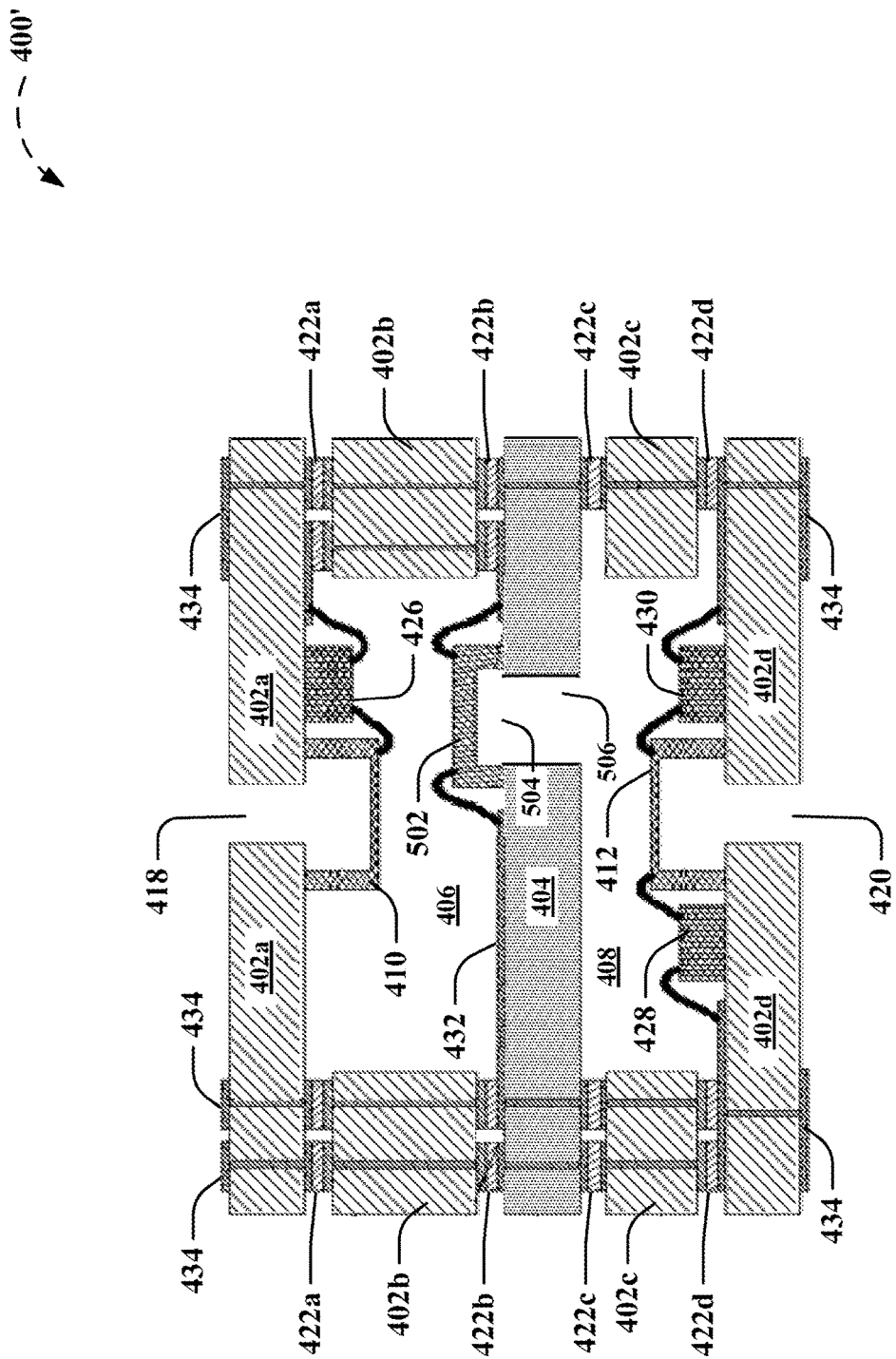
FIG. 5 depicts another non-limiting example of the other microphone package, in accordance with various aspects and implementations described herein.

FIG. 5 depicts a device 400', according to various non-limiting aspects of the subject disclosure. The device 400' can be, for example, a microphone package (e.g., a microphone package with an integrated DSP). For example, the device 400' can be a microphone housing (e.g., a microphone module). The device 400' can be a different embodiment of the device 400. For example, instead of the ASIC 422, the device 400' includes a third sensor 502. In one example, the third sensor 502 can be a third MEMS sensor. For example, the third sensor 502 can be a MEMS microphone (e.g., a MEMS microphone component, a MEMS microphone element, a MEMS microphone sensor, etc.), such as but not limited to, a capacitive MEMS microphone, a piezoelectric MEMS microphone, a piezoresistive MEMS microphone, a condenser MEMS microphone, an electret MEMS microphone, an analog MEMS microphone, a digital MEMS microphone, another type of MEMS microphone, etc. The third sensor 502 can also be associated with a cavity 504. For example, the cavity 504 can be an etched cavity in the third sensor 502. The cavity 504 can increase an effective back volume of the second back cavity 408. Furthermore, the device 400 can include an internal aperture 506. For example, the DSP 404 can include the internal aperture 506. The internal aperture 506 can allow the third sensor 502 to be in acoustic communication with the second back cavity 408 while keeping the first back cavity 406 and the second back cavity 408 isolated.

Figure 6:
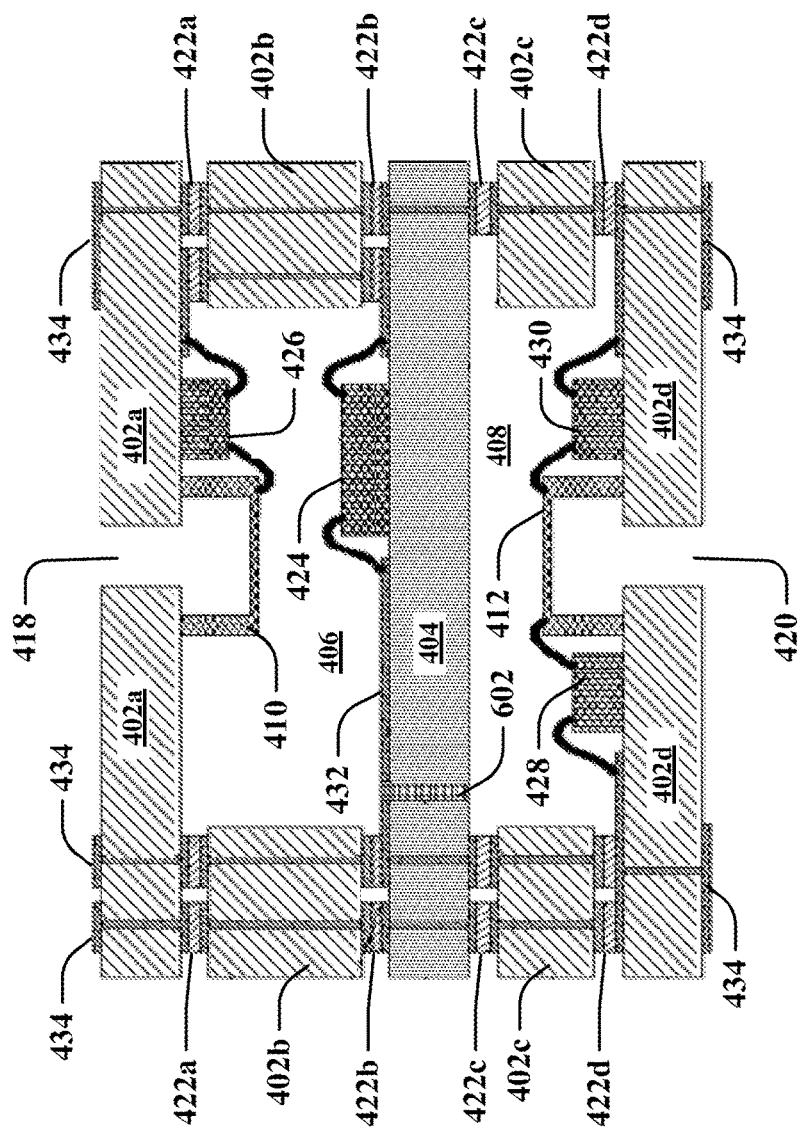
FIG. 6 depicts yet another non-limiting example of the other microphone package, in accordance with various aspects and implementations described herein.

FIG. 6 depicts a device 400", according to various non-limiting aspects of the subject disclosure. The device 400" can be, for example, a microphone package (e.g., a microphone package with an integrated DSP). For example, the device 400" can be a microphone housing (e.g., a microphone module). The device 400" can be a different embodiment of the device 400 and/or the device 400'. For example, the device 400" includes a vent 602. The vent 602 can be formed, for example, in DSP 404. The vent 602 can control acoustic impedance between the first back cavity 406 and the second back cavity 408. For example, the vent 602 allow the first back cavity 406 to be in acoustic communication with the second back cavity 408.

The devices (e.g., microphone packages) disclosed herein (e.g., the device 100, the device 100', the device 100", the device 400, the device 400', the device 400", etc.) can provide improved beam forming characteristics and/or noise cancelling characteristics associated with microphone data. For example, a DSP (e.g., the DSP 104, the DSP 204, the DSP 304, the DSP 404, etc.) in the devices (e.g., microphone packages) disclosed herein (e.g., the device 100, the device 100', the device 100", the device 400, the device 400', the device 400", etc.) can be in close proximity to a first sensor (e.g., a first MEMS sensor) and a second sensor (e.g., a second MEMS sensor) that provide data to the DSP. Therefore, a DSP (e.g., the DSP 104, the DSP 204, the DSP 304, the DSP 404, etc.) in the devices (e.g., microphone packages) disclosed herein (e.g., the device 100, the device 100', the device 100", the device 400, the device 400', the device 400", etc.) can generate microphone data with lower noise levels, improved beam forming characteristics, improved noise cancelling characteristics and/or other improved signal characteristics based on the data provided to the DSP from the first sensor (e.g., the first MEMS sensor) and the second sensor (e.g., the second MEMS sensor) in close proximity to the DSP. Moreover, a physical size of a microphone package can be reduced by employing devices (e.g., microphone packages) disclosed herein (e.g., the device 100, the device 100', the device 100", the device 400, the device 400', the device 400", etc.).

Figure 7:
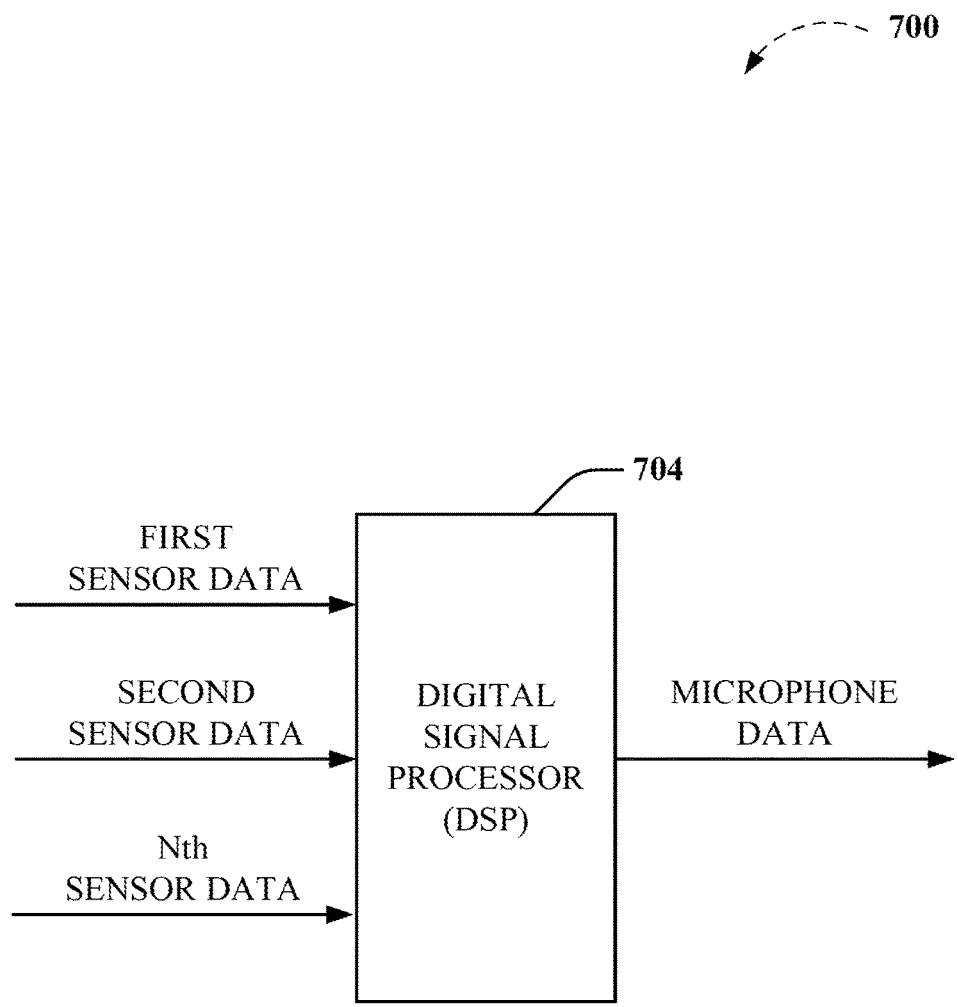
FIG. 7 depicts a functional block diagram of a system, in accordance with various aspects and implementations described herein.

FIG. 7 depicts a functional block diagram of a system 700, according to various non-limiting aspects of the subject disclosure. The system 700 includes a DSP 704. For example, the DSP 704 can correspond to the DSP 104, the DSP 204, the DSP 304 or the DSP 404. The DSP 704 can receive at least first sensor data (e.g., FIRST SENSOR DATA shown in FIG. 7) and second sensor data (e.g., SECOND SENSOR DATA shown in FIG. 7). The first sensor data can be associated with a first sensor (e.g., a first MEMS sensor) contained in a first back cavity formed by the DSP 704 and a substrate (e.g., the substrate 102, the substrate 202, the substrate 302 or the substrate 402). For example, the first sensor data can be data (e.g., a signal, a voltage, etc.) generated by a first sensor (e.g., a first MEMS sensor) contained in a first back cavity formed by the DSP 704 and a substrate. In one example, the first sensor data can be associated with the first sensor 110 contained in the first back cavity 106 of the device 100, the first sensor 210 contained in the first back cavity 206 of the device 100', the first sensor 310 contained in the first back cavity 306 of the device 100", or the first sensor 410 contained in the first back cavity 406 (e.g., the first back cavity 406 of the device 400, the device 400' or the device 400"). Furthermore, the second sensor data can be associated with a second sensor (e.g., a second MEMS sensor) contained in a second back cavity formed by the DSP 704 and a substrate (e.g., the substrate 102, the substrate 202, the substrate 302 or the substrate 402). For example, the second sensor data can be data (e.g., a signal, a voltage, etc.) generated by a second sensor (e.g., a second MEMS sensor) contained in a second back cavity formed by the DSP 704 and a substrate. In one example, the second sensor data can be associated with the second sensor 112 contained in the second back cavity 108 of the device 100, the second sensor 212 contained in the second back cavity 208 of the device 100', the second sensor 312 contained in the second back cavity 308 of the device 100", or the second sensor 412 contained in the second back cavity 408 (e.g., the second back cavity 408 of the device 400, the device 400' or the device 400"). It is to be appreciated that the DSP 704 can additionally receive other sensor data (e.g., Nth SENSOR DATA shown in FIG. 7). In a non-liming example, the DSP can receive third sensor data associated with a third sensor contained in the first back cavity 106 of the device 100, the first back cavity 206 of the device 100', the first back cavity 306 of the device 100", or the first back cavity 406 (e.g., the first back cavity 406 of the device 400, the device 400' or the device 400"). Additionally, the DSP can receive fourth sensor data associated with a fourth sensor contained in the second back cavity 108 of the device 100, the second back cavity 208 of the device 100', the second back cavity 308 of the device 100", or the second back cavity 408 (e.g., the second back cavity 408 of the device 400, the device 400' or the device 400").

In an aspect, the DSP 704 can generate microphone data (e.g., MICROPHONE DATA shown in FIG. 7) based on the first sensor data and the second sensor data. For example, the DSP 704 can generate a microphone pattern (e.g., a cardioid microphone pattern, etc.) based on the first sensor data and the second sensor data. In another aspect, the DSP 704 can generate a noise suppressed signal (e.g., a noise suppressed microphone signal) based on the first sensor data and the second sensor data. For example, the DSP 704 can generate a noise suppressed signal (e.g., a noise suppressed microphone signal) based on a set of cardioid signals associated with a microphone pattern (e.g., a cardioid microphone pattern) generated as a function of the first sensor data and the second sensor data. In another example, the DSP 704 can generate a noise suppressed signal based on a level of difference between a first cardioid signal associated with the first sensor data and a second cardioid signal associated with the second sensor data. Additionally, the DSP 704 can determine a first transfer function for the first cardioid signal associated with the first sensor data and a second transfer function for the second cardioid signal associated with the second sensor data. Then, based on the first transfer function and the second transfer function, the DSP 704 can generate the noise suppressed signal.

In an implementation, the DSP 704 can process, filter and/or analyze frequency bands of the first sensor data and/or other frequency bands of the second sensor data. In one example, the DSP 704 can analyze the frequency bands of the first sensor data and/or the other frequency bands of the second sensor data based on a set of acoustic models. In yet another aspect, the DSP 104 can generate synthetic directional microphone patterns based on the first sensor data and the second sensor data. In yet another aspect, the DSP 104 can apply a weight (e.g., an equalization coefficient, a noise suppression coefficient, an adaptive constraint, a gain, etc.) to the first sensor data and the second sensor data. However, it is to be appreciated that the DSP 704 can also include other functionalities as more fully disclosed herein with respect to the DSP 104, the DSP 204, the DSP 304 and/or the DSP 404.

In an implementation, a device and/or system disclosed herein (e.g., the device 100, the device 100', the device 100", the device 400, the device 400', the device 400", the system 700, etc.) can be included in and/or associated with a consumer electronic device. For example, a device and/or system disclosed herein (e.g., the device 100, the device 100', the device 100", the device 400, the device 400', the device 400", the system 700, etc.) can be included in and/or associated with a phone, a smartphone, a smartwatch, a tablet, an eReader, a netbook, an automotive navigation device, a gaming console or device, a wearable computing device, another type of computing device, etc.

While various embodiments for a microphone package with an integrated DSP according to aspects of the subject disclosure have been described herein for purposes of illustration, and not limitation, it can be appreciated that the subject disclosure is not so limited. Various implementations can be applied to other areas for beam forming, noise cancellation and/or a microphone package with an integrated DSP, without departing from the subject matter described herein. For instance, it can be appreciated that other applications requiring beam forming functionality, noise cancellation functionality and/or a microphone package with an integrated DSP can employ aspects of the subject disclosure. Furthermore, various exemplary implementations of systems as described herein can additionally, or alternatively, include other features, functionalities and/or components and so on.

Figure 8:
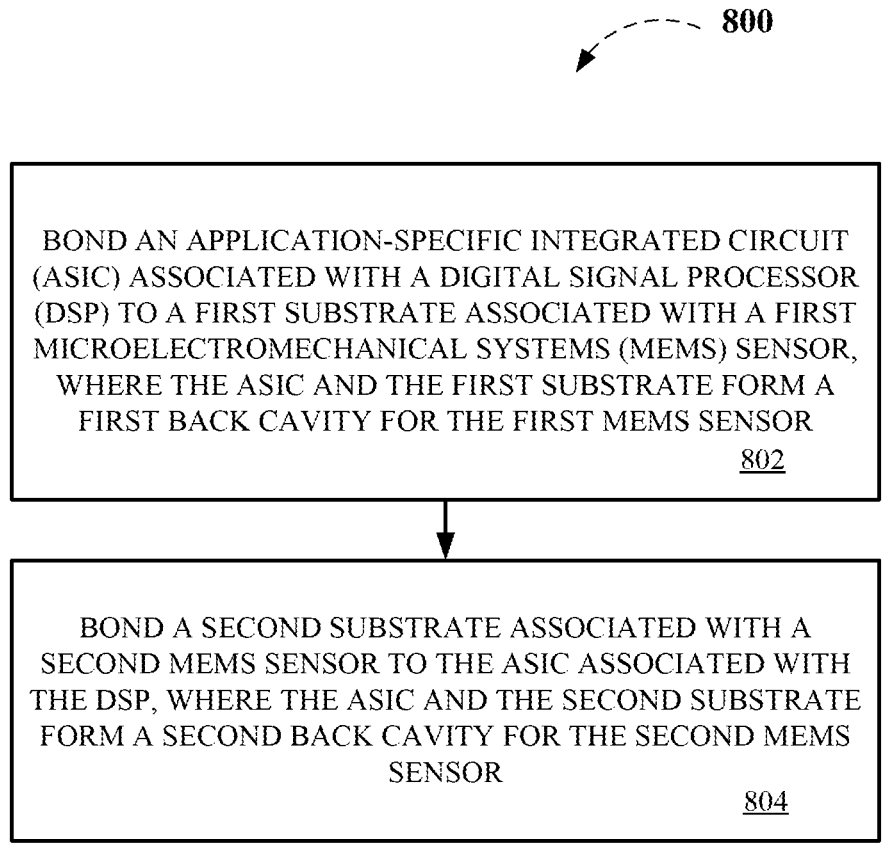
FIG. 8 is a flowchart an example methodology for fabricating a microphone package, in accordance with various aspects and implementations described herein.
Figure 9:
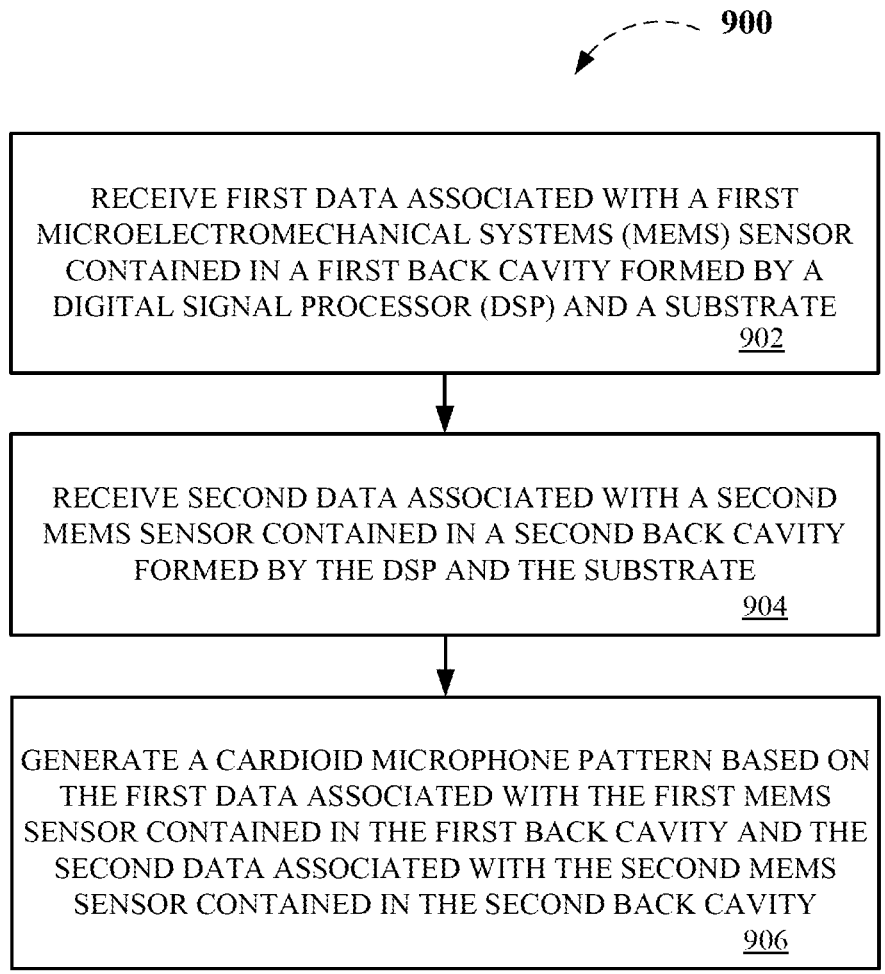
FIG. 9 is a flowchart of an example methodology for generating microphone data, in accordance with various aspects and implementations described herein.
Figure 10:
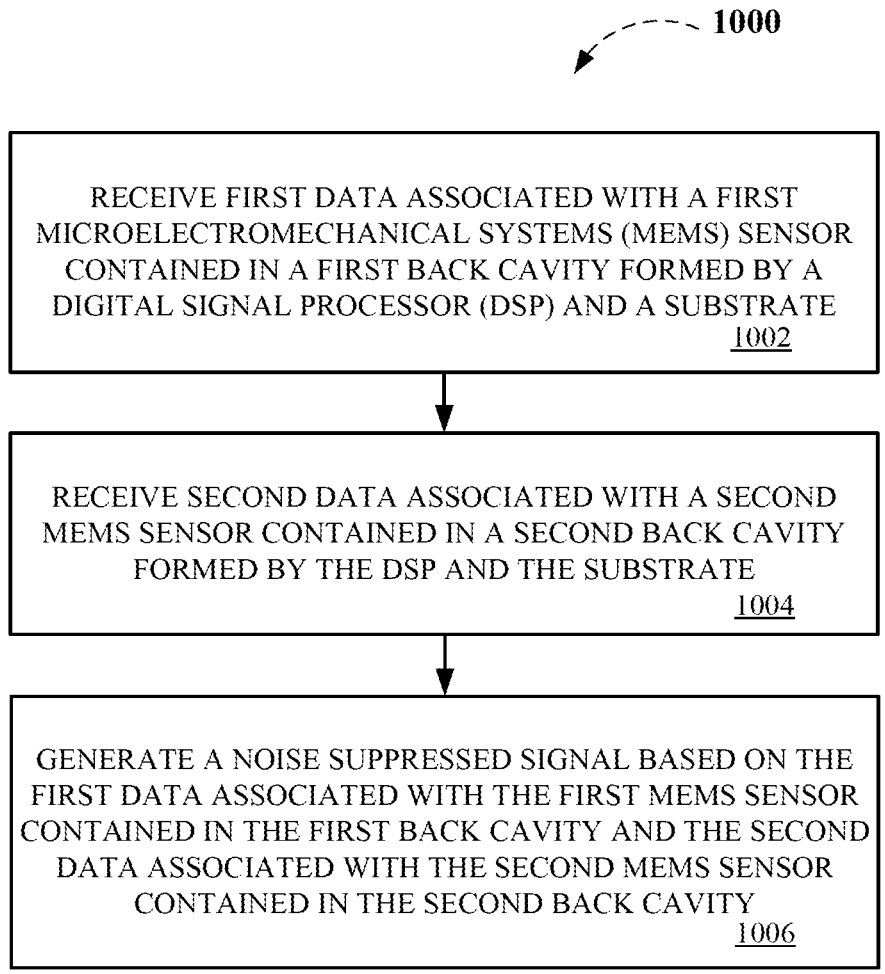
FIG. 10 is a flowchart of another example methodology for generating microphone data, in accordance with various aspects and implementations described herein.

In view of the subject matter described supra, methods that can be implemented in accordance with the subject disclosure will be better appreciated with reference to the flowcharts of FIGS. 8-10. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 8 depicts an exemplary flowchart of a non-limiting method 800 for fabricating a microphone package, according to various non-limiting aspects of the subject disclosure. In an example, the method 800 can be associated with the device 400, the device 400' or the device 400". Initially, at 802, an application-specific integrated circuit (ASIC) associated with a digital signal processor (DSP) is bonded to a first substrate associated with a first microelectromechanical systems (MEMS) sensor, where the ASIC and the first substrate form a first back cavity for the first MEMS sensor. The first substrate can be, for example, a laminate substrate. In one example, the first substrate can include a first substrate layer (e.g., first substrate layer 402a) and a second substrate layer (e.g., second substrate layer 402b). The first substrate layer can be attached to the second substrate layer via a conductive joining layer (e.g., first conductive joining layer 422a). In another example, the first substrate can be a MEMS die (e.g., a MEMS semiconducting die). For example, the first substrate can be a MEMS die that includes a set of conductive vias within the first substrate layer and the second substrate layer of the first substrate. In an aspect, the ASIC can be bonded to the first substrate via Eutectic bonding.

At 804, a second substrate associated with a second MEMS sensor is bonded to the ASIC associated with the DSP, where the ASIC and the second substrate form a second back cavity for the second MEMS sensor. The second substrate can be, for example, a laminate substrate. In one example, the second substrate can include a first substrate layer (e.g., third substrate layer 402c) and a second substrate layer (e.g., fourth substrate layer 402d). The first substrate layer can be attached to the second substrate layer via a conductive joining layer (e.g., fourth conductive joining layer 422d). In another example, the second substrate can be a MEMS die (e.g., a MEMS semiconducting die). For example, the second substrate can be a MEMS die that includes a set of conductive vias within the first substrate layer and the second substrate layer of the second substrate. In an aspect, the second substrate can be bonded to the ASIC via Eutectic bonding.

FIG. 9 depicts an exemplary flowchart of a non-limiting method 900 for generating microphone data, according to various non-limiting aspects of the subject disclosure. In an aspect, the method 900 can be associated with a digital signal processor (e.g., the DSP 104, the DSP 204, the DSP 304, the DSP 404 or the DSP 704). Initially, at 902, first data associated with a first microelectromechanical systems (MEMS) sensor is received, where the first MEMS sensor is contained in a first back cavity formed by a digital signal processor (DSP) and a substrate. For example, the first data can be data generated by the first MEMS sensor contained in the first back cavity formed by the DSP and the substrate.

At 904, second data associated with a second MEMS sensor is received, where the second MEMS sensor is contained in a second back cavity formed by the DSP and the substrate. For example, the second data can be data generated by the second MEMS sensor contained in the second back cavity formed by the DSP and the substrate.

At 906, a cardioid microphone pattern is generated based on the first data associated with the first MEMS sensor contained in the first back cavity and the second data associated with the second MEMS sensor contained in the second back cavity. In an aspect, a first cardioid microphone pattern can be generated based on the first data and a second cardioid microphone pattern can be generated based on the second data. In an implementation, other sensor data (e.g., third data, fourth data, etc.) associated with other sensor(s) contained in the first back cavity and/or the second back cavity can be received. Therefore, the cardioid microphone pattern can additionally be generated based on other sensor data associated with other sensor(s) contained in the first back cavity and/or the second back cavity.

FIG. 10 depicts an exemplary flowchart of a non-limiting method 1000 for generating microphone data, according to various non-limiting aspects of the subject disclosure. In an aspect, the method 1000 can be associated with a digital signal processor (e.g., the DSP 104, the DSP 204, the DSP 304, the DSP 404 or the DSP 704). Initially, at 1002, first data associated with a first microelectromechanical systems (MEMS) sensor is received, where the first MEMS sensor is contained in a first back cavity formed by a digital signal processor (DSP) and a substrate. For example, the first data can be data generated by the first MEMS sensor contained in the first back cavity formed by the DSP and the substrate.

At 1004, second data associated with a second MEMS sensor is received, where the second MEMS sensor is contained in a second back cavity formed by the DSP and the substrate. For example, the second data can be data generated by the second MEMS sensor contained in the second back cavity formed by the DSP and the substrate.

At 1006, a noise suppressed signal is generated based on the first data associated with the first MEMS sensor contained in the first back cavity and the second data associated with the second MEMS sensor contained in the second back cavity. For example, the noise suppressed signal can be generated based on a level of difference between a first cardioid signal associated with the first data and a second cardioid signal associated with the second data. In another example, a first transfer function can be determined for a first cardioid signal associated with the first data and a second transfer function can be determined for a second cardioid signal associated with the second data. Therefore, the noise suppressed signal can be generated based on the first transfer function and the second transfer function. In an implementation, other sensor data (e.g., third data, fourth data, etc.) associated with other sensor(s) contained in the first back cavity and/or the second back cavity can be received. Therefore, the noise suppressed signal can additionally be generated based on other sensor data associated with other sensor(s) contained in the first back cavity and/or the second back cavity.

It is to be appreciated that various exemplary implementations of exemplary methods 800, 900 and 1000 as described can additionally, or alternatively, include other process steps associated with features or functionality for communicating data as a function of frequency, as further detailed herein, for example, regarding FIGS. 1-7.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described. In some embodiments, a component can comprise software instructions stored on a memory and executed by a processor (e.g., DSP 104, DSP 204, DSP 304, DSP 404, DSP 704, another processor, etc.). Memory can be a computer-readable storage medium storing computer-executable instructions and/or information for performing the functions described herein with reference to the systems and/or methods disclosed.

As used in this application, the terms "component," "system," "interface," and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

Various aspects or features described herein can be implemented as a method, apparatus, system, or article of manufacture using standard programming or engineering techniques. In addition, various aspects or features disclosed in this disclosure can be realized through program modules that implement at least one or more of the methods disclosed herein, the program modules being stored in a memory and executed by at least a processor. Other combinations of hardware and software or hardware and firmware can enable or implement aspects described herein, including a disclosed method(s). The term "article of manufacture" as used herein can encompass a computer program accessible from any computer-readable device, carrier, or storage media. For example, computer readable storage media can include but are not limited to magnetic storage devices (e.g., hard disk, floppy disk, magnetic strips . . . ), optical discs (e.g., compact disc (CD), digital versatile disc (DVD), blu-ray disc (BD) . . . ), smart cards, and flash memory devices (e.g., card, stick, key drive . . . ), or the like.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or methods herein are intended to include, without being limited to including, these and any other suitable types of memory.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A device, comprising:
   a first microelectromechanical systems (MEMS) sensor contained in a first back cavity within the device;
   a second MEMS sensor contained in a second back cavity within the device; and
   a digital signal processor configured to generate a cardioid microphone pattern based on data associated with the first MEMS sensor contained in the first back cavity and other data associated with the second MEMS sensor contained in the second back cavity, wherein the digital signal processor forms a back wall of the first back cavity and at least a portion of the second back cavity, and wherein the second MEMS sensor is mechanically affixed to the digital signal processor associated with the second back cavity.

2. The device of claim 1, wherein the back wall associated with the digital signal processor defines a back volume partition for the first back cavity and the second back cavity.

3. The device of claim 1, wherein the back wall is shared between the first back cavity and the second back cavity.

4. The device of claim 1, wherein a substrate forms another portion of the second back cavity.

5. The device of claim 4, wherein the substrate comprises a first substrate portion and a second substrate portion separated by an opening associated with the first back cavity.

6. The device of claim 4, wherein the substrate comprises a first substrate portion, a second substrate portion separated from the first substrate portion via an opening associated with the first back cavity, and a third substrate portion separated from the second substrate portion via another opening associated with the second back cavity.

7. The device of claim 1, wherein the digital signal processor is configured to generate a noise suppressed signal based on a first cardioid signal associated with the first MEMS sensor contained in the first back cavity and a second cardioid signal associated with the second MEMS sensor contained in the second back cavity.

8. The device of claim 7, wherein the digital signal processor is configured to generate the noise suppressed signal based on a level of difference between the first cardioid signal associated with the first MEMS sensor contained in the first back cavity and the second cardioid signal associated with the second MEMS sensor contained in the second back cavity.

9. The device of claim 7, wherein the digital signal processor is configured to determine a first transfer function for the first cardioid signal associated with the first MEMS sensor contained in the first back cavity and a second transfer function for the second cardioid signal associated with the second MEMS sensor contained in the second back cavity.

10. The device of claim 9, wherein the digital signal processor is configured to generate the noise suppressed signal based on the first transfer function and the second transfer function.

11. The device of claim 1, wherein the digital signal processor is configured to generate a first cardioid microphone pattern based on the data associated with the first MEMS sensor contained in the first back cavity and a second cardioid microphone pattern based on the other data associated with the second MEMS sensor contained in the second back cavity.

12. The device of claim 1, wherein the first back cavity comprises a third MEMS sensor and the second back cavity comprises a fourth MEMS sensor.

13. A system, comprising:
a digital signal processor configured to:
receive first data associated with a first microelectromechanical systems (MEMS) sensor contained in a first back cavity formed by the digital signal processor and a substrate, wherein the digital signal processor forms a back wall of the first back cavity;
receive second data associated with a second MEMS sensor contained in a second back cavity formed by the digital signal processor and the substrate, wherein the second MEMS sensor is mechanically affixed to the digital signal processor associated with the second back cavity, and
generate microphone data based on the first data associated with the first MEMS sensor contained in the first back cavity and the second data associated with the second MEMS sensor contained in the second back cavity.

14. The system of claim 13, wherein the digital signal processor is configured to generate a cardioid microphone pattern based on the first data associated with the first MEMS sensor contained in the first back cavity and the second data associated with the second MEMS sensor contained in the second back cavity.

15. The system of claim 14, wherein the digital signal processor is configured to generate a noise suppressed signal based on a set of cardioid signals associated with the cardioid microphone pattern.

16. The system of claim 13, wherein the digital signal processor is configured to generate a noise suppressed signal based on a level of difference between a first cardioid signal associated with the first data and a second cardioid signal associated with the second data.

17. The system of claim 14, wherein the digital signal processor is configured to determine a first transfer function for the first cardioid signal associated with the first data and a second transfer function for the second cardioid signal associated with the second data.

18. The system of claim 15, wherein the digital signal processor is configured to generate the noise suppressed signal based on the first transfer function and the second transfer function.

19. A method, comprising:
bonding an application-specific integrated circuit (ASIC) associated with a digital signal processor to a first substrate associated with a first microelectromechanical systems (MEMS) sensor, wherein the ASIC and the first substrate form a first back cavity for the first MEMS sensor, and wherein the ASIC forms a back wall of the first back cavity; and
bonding a second substrate associated with a second MEMS sensor to the ASIC associated with the digital signal processor, wherein the ASIC and the second substrate form a second back cavity for the second MEMS sensor, and wherein the second MEMS sensor is mechanically affixed to the digital signal processor.

20. The method of claim 19, wherein the bonding the ASIC to the first substrate includes bonding the ASIC to the first substrate via Eutectic bonding.

21. The method of claim 19, wherein the bonding the second substrate to the ASIC includes bonding the second substrate to the ASIC via Eutectic bonding.

* * * * *